United States Patent
Joo et al.

(10) Patent No.: US 9,570,178 B2
(45) Date of Patent: Feb. 14, 2017

(54) SEMICONDUCTOR MEMORY DEVICE AND OPERATING METHOD THEREOF

(71) Applicant: SK hynix Inc., Gyeonggi-do (KR)

(72) Inventors: Byoung In Joo, Gyeonggi-do (KR); Byoung Young Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 14/723,168

(22) Filed: May 27, 2015

(65) Prior Publication Data

US 2016/0211025 A1    Jul. 21, 2016

(30) Foreign Application Priority Data

Jan. 20, 2015    (KR) .................. 10-2015-0009384

(51) Int. Cl.
| | |
|---|---|
| *G11C 16/04* | (2006.01) |
| *G11C 16/10* | (2006.01) |
| *G11C 16/26* | (2006.01) |
| *G11C 5/02* | (2006.01) |
| *G11C 11/56* | (2006.01) |
| *G11C 16/32* | (2006.01) |

(52) U.S. Cl.
CPC ............ *G11C 16/10* (2013.01); *G11C 5/02* (2013.01); *G11C 11/5628* (2013.01); *G11C 11/5642* (2013.01); *G11C 16/26* (2013.01); *G11C 16/32* (2013.01); *G11C 2211/5631* (2013.01); *G11C 2211/5648* (2013.01)

(58) Field of Classification Search
CPC .............. G11C 16/3427; G11C 2029/1202; G11C 7/00; G11C 7/1045
See application file for complete search history.

(56) References Cited

U.S. PATENT DOCUMENTS

| | | | | |
|---|---|---|---|---|
| 7,898,866 B2* | 3/2011 | Yoon | ........................ | G11C 8/10 |
| | | | | 365/185.2 |
| 8,976,584 B2* | 3/2015 | Han | ..................... | G06F 12/0246 |
| | | | | 365/185.03 |
| 2010/0322000 A1* | 12/2010 | Shim | ................... | G11C 11/5628 |
| | | | | 365/185.03 |
| 2012/0033498 A1* | 2/2012 | Kim | .................... | G11C 11/5642 |
| | | | | 365/185.18 |
| 2016/0099047 A1* | 4/2016 | Lee | ...................... | G11C 7/1039 |
| | | | | 365/185.03 |

FOREIGN PATENT DOCUMENTS

| | | |
|---|---|---|
| KR | 1020110001575 | 1/2011 |
| KR | 1020120077277 | 7/2012 |

* cited by examiner

*Primary Examiner* — Tuan T Nguyen
(74) *Attorney, Agent, or Firm* — IP & T Group LLP

(57) ABSTRACT

The invention relates to a semiconductor memory device and an operating method thereof. The semiconductor memory device includes a first plane and a second plane each including a plurality of memory blocks, a first read and write circuit and a second read and write circuit suitable for sensing and temporarily storing data programmed into the first and second planes, respectively, and a control logic suitable for controlling the first and second read and write circuits to perform a read operation on the first and second planes, respectively, wherein the control logic controls the first and second read and write circuits to set the temporarily stored data as setting data, performs a new read operation to store new data, or maintains the temporarily stored data, depending on whether the first and second planes are in an LSB program state or an MSB program state.

21 Claims, 5 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2015-0009384, filed on Jan. 20, 2015, the entire disclosure of which is herein incorporated by reference in its entirety.

BACKGROUND

Field of Invention

Various embodiments relate generally to an electronic device and, more particularly, to a semiconductor memory device and an operating method thereof.

Description of Related Art

The demand for non-volatile memory devices that can be electrically programmed and erased without refresh operations for rewriting data at predetermined intervals is increasing.

Conventional non-volatile memory devices have multiple memory blocks located on a single plane. Recently, new technology has come about where memory blocks are stacked on multiple planes.

In a non-volatile memory device, a program operation writes data into memory cells, a read operation reads data stored in the memory cells, and an erase operation erases data from the memory cells.

A multi-level cell program method stores two or more bits of information in a single cell. In a single level cell program method, two different states that are distinguished by threshold voltages are generated. However, in the multi-level cell program method, the programming operation may be repeated to store two or more bits of information. In a multi-level cell program operation, a least significant bit (LSB) program operation and a most significant bit (MSB) program operation are generally performed.

Conventionally, when data is read from two planes at the same time, a read operation may be performed depending on whether an MSB program operation is performed on both of the planes. In other words, only when both of the planes are programmed using MSB or LSB program operations can the read operation be performed on two planes at the same time. The read operation may be performed when the two planes are in the same MSB program state. Therefore, conventionally, when two planes are in different program states, a read operation cannot be performed on both planes at the same time.

SUMMARY

Various embodiments are directed to a semiconductor memory device capable of simultaneously reading a plurality of planes during a read operation of a semiconductor memory device, and an operating method thereof.

According to an embodiment of the present invention, a semiconductor memory device may include a first plane and a second plane each including a plurality of memory blocks, a first read and write circuit and a second read and write circuit suitable for sensing and temporarily storing data programmed into the first and second planes, respectively, and a control logic suitable for controlling the first and second read and write circuits to perform a read operation on the first and second planes, respectively, wherein the control logic controls the first and second read and write circuits to set the temporarily stored data as setting data, performs a new read operation to store new data, or maintains the temporarily stored data, depending on whether the first and second planes are in an LSB program state or an MSB program state.

According to an embodiment of the present invention, a semiconductor memory device may include a first plane and a second plane each including a plurality of memory blocks, a first read and write circuit and a second read and write circuit suitable for sensing and temporarily storing data programmed into the first and second planes, respectively, and a control logic suitable for determining first and second flag data respectively stored in the first and second planes, and outputting first and second page buffer control signals to respectively control the first and second read and write circuits to set the temporarily stored data as setting data or maintain the temporarily stored data.

According to an embodiment of the present invention, an operating method of a semiconductor memory device may include determining an LSB read operation or an MSB read operation in response to an address signal, performing a first read operation using a first read voltage when the MSB read operation is determined, checking a program state of each of a first plane and a second plane, setting MSB data of the first plane as setting data when the first plane is determined to be in an LSB program state, and setting MSB data of the second plane as the setting data when the second plane is determined to be in the LSB program state, and reading MSB data of the first plane by performing a third read operation using a third read voltage when the first plane is determined to be in an MSB program state, and reading MSB data of the second plane by performing the third read operation when the second plane is determined to be in the MSB program state.

DETAILED DESCRIPTION

Figure 1:
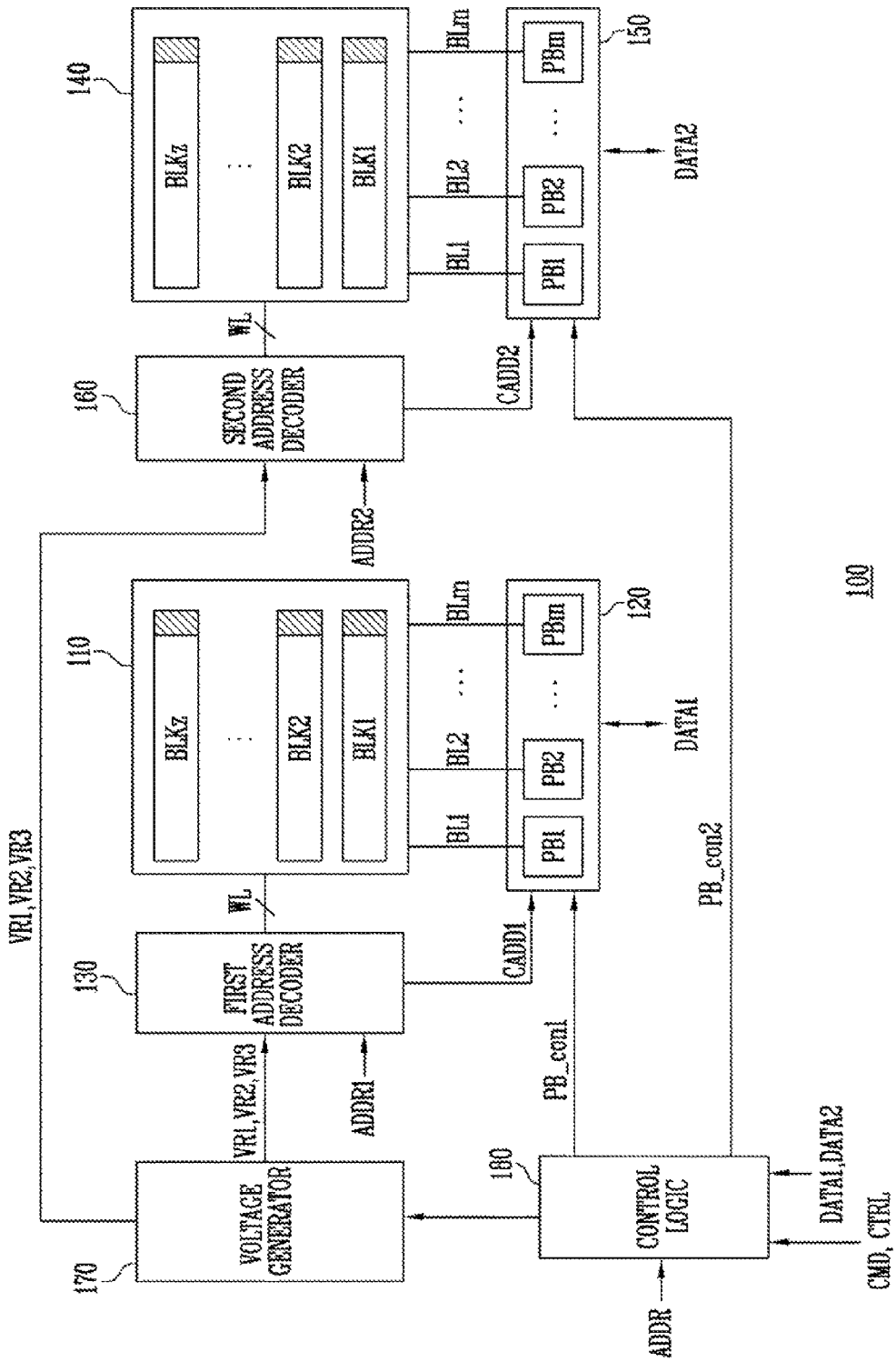
FIG. 1 is a block diagram illustrating a semiconductor memory device according to an embodiment.

Hereinafter, various exemplary embodiments will be described in detail with reference to the accompanying drawings. In the drawings, thicknesses and lengths of components may be exaggerated for convenience. In the following description, a detailed explanation of related functions and constitutions may be omitted for simplicity and conciseness. Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned. Additionally, 'include/comprise' or 'including/comprising' used in the specification represents that one or more components, steps, operations, and elements exists or are added.

FIG. 1 is a block diagram illustrating a semiconductor memory device according to an embodiment.

Referring to FIG. 1, the semiconductor memory device 100 may include a first memory plane 110, a first read and write circuit 120, a first address decoder 130, a second memory plane 140, a second read and write circuit 150, a second address decoder 160, a voltage generator 170, and a control logic 180.

Each of the first plane 110 and the second plane 140 may include a plurality of memory blocks BLK1 to BLKz. The plurality of memory blocks BLK1 to BLKz may be coupled to the first address decoder 130 and the second address decoder 160 through word lines WL. The plurality of memory blocks BLK1 to BLKz may be coupled to the first read and write circuit 120 and the second read and write circuit 150 through bit lines BL1 to BLm. Each of the memory blocks BLK1 to BLKz may include a plurality of memory cells. In addition, each memory block may include the memory cells for storing data therein and a flag cell for storing information on whether an MSB program operation or an LSB program operation is performed on the memory cells. In the first plane 110 and the second plane 140, hatched portions refers to flag cells. According to an embodiment, the plurality of memory cells may be non-volatile memory cells. Among the plurality of memory cells, memory cells coupled to the same word line may be defined as a single page. In other words, a memory cell array, i.e., each of the first plane 110 and the second plane 140, may include a plurality of pages.

In addition, each of the plurality of memory blocks BLK1 to BLKz of the first plane 110 and the second plane 140 may include a plurality of cell strings. Each of the plurality of cell strings may include a drain selection transistor, a first memory cell group, a pipe transistor, a second memory cell group and a source selection transistor which are coupled in series between a bit line and a source line. According to an embodiment, the memory cell array may include a vertical memory cell array having a three-dimensional structure.

The first address decoder 130 and the second address decoder 160 may be coupled to the first plane 110 and the second plane 140, respectively, through the word lines WL. The first address decoder 130 may receive an address signal ADDR1, apply first to third read voltages VR1 to VR3 generated by the voltage generator 170 to a selected word line, among the word lines WL of the first plane 110, during a read operation, and output a column address CADD1 to the first read and write circuit 120 based on the address signal ADDR1. The second address decoder 160 may receive an address signal ADDR2, apply the first to third read voltages VR1 to VR3 generated by the voltage generator 170 to a selected word line, among the word lines WL of the second plane 140, during the read operation, and output a column address CADD2 to the second read and write circuit 150 based on the address signal ADDR2.

Each of the first read and write circuit 120 and the second read and write circuit 150 may include a plurality of page buffers PB1 to PBm. The page buffers PB1 to PBm may be coupled to the first plane 110 and the second plane 140, respectively, through the bit lines BL1 to BLm. Each of the page buffers PB1 to PBm may sense a voltage or a current of each of the bit lines BL1 to BLm during the read operation and temporarily store read data. Flag data DATA1 and DATA2 stored in the flag cell, among the stored data, may be output to the control logic 180. The first read and write circuit 120 and the second read and write circuit 150 may reset the temporarily stored data during a data setting operation. That is, the first read and write circuit 120 and the second read and write circuit 150 may change or maintain the temporarily stored data, and store the data during the data setting operation.

The first read and write circuit 120 and the second read and write circuit 150 may operate in response to page buffer control signals PB_con1 and PB_con2 output from the control logic 180 and the column addresses CADD1 and CADD2 output from the first address decoder 130 and the second address decoder 160, respectively.

The voltage generator 170 may generate the read voltages VR1 to VR3 to be applied to a selected memory block during the read operation. The voltage generator 170 may generate these read voltages under the control of the control logic 180.

The control logic 180 may be coupled to the first and second read and write circuits 120 and 150 and the voltage generator 170. The control logic 180 may receive a command CMD, a control signal CTRL and an address ADDR which are input through an input/output buffer (not illustrated) of the semiconductor memory device 100. The control logic 180 may be configured to control the general operations of the semiconductor memory device 100 in response to the command CMD, the control signal CTRL and the address ADDR.

During the read operation, the semiconductor memory device 100 may select a Most Significant Bit (MSB) read operation or a Least Significant Bit (LSB) read operation according to the address ADDR being input, determine program states of the first plane 110 and the second plane 140 based on the flag data DATA1 and DATA2 input from the first and second read and write circuits 120 and 150, respectively, and output the page buffer control signals PB_con1 and PB_con2 to perform the data setting operation to reset the data temporarily stored in the first and second read and write circuits 120 and 150.

Figure 2:
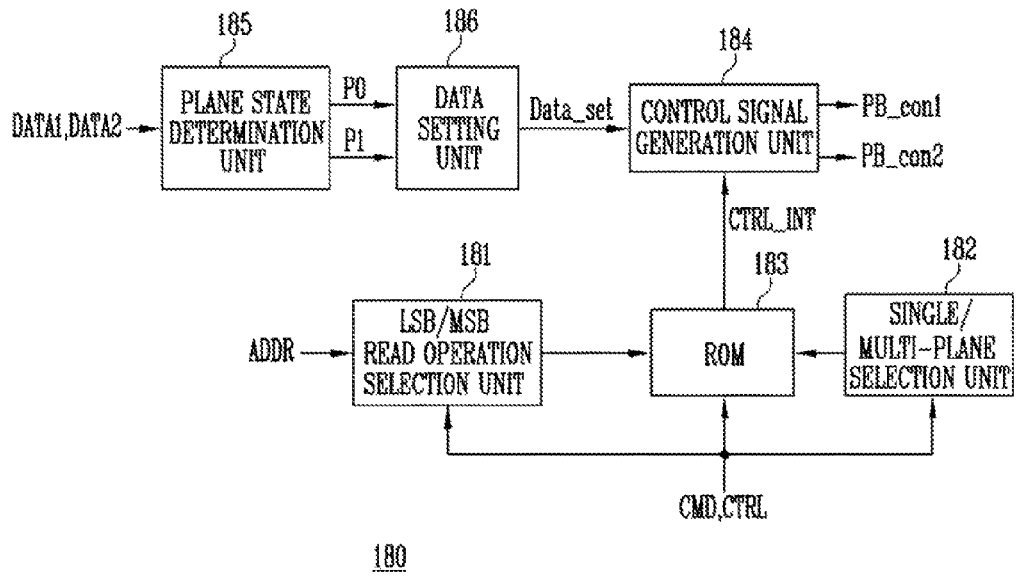
FIG. 2 is a detailed block diagram illustrating a control logic according to an embodiment.

FIG. 2 is a detailed block diagram illustrating the control logic according to an embodiment.

Referring to FIG. 2, the control logic 180 may include an LSB/MSB read operation selection unit 181, a single/multi-plane selection unit 182, a storage unit 183, a control signal generation unit 184, a plane state determination unit 185, and a data setting unit 186.

The LSB/MSB read operation selection unit 181 may determine an LSB read operation or an MSB read operation in response to the command CMD, the control signal CTRL and the address ADDR, which are externally input, and output a first determination result to the storage unit 183.

During a read operation of the semiconductor memory device, the single/multi-plane selection unit 182 may determine whether the read operation is performed on a single plane, or on multiple planes, in response to the command CMD and the control signal CTRL, and output a second determination result to the storage unit 183.

The storage unit 183 may store an algorithm for the general operations of the semiconductor memory device; select a detailed operation from the general operations of the semiconductor memory device, in response to the command CMD, the control signal CTRL, and the first and second determination results respectively output from the LSB/MSB read operation selection unit 181 and the single/multi-plane selection unit 182; and output an internal control signal CTRL_INT in response to the algorithm to perform the detailed operation. The storage unit 183 may be implemented with a read-only memory (ROM).

The control signal generation unit 184 may output the page buffer control signals PB_con1 and PB_con2 to control the first and second read and write circuits 120 and 150, respectively, in response to the internal control signal CTRL_INT output from the storage unit 183.

In addition, the control signal generation unit 184 may output the page buffer control signals PB_con1 and PB_con2 to maintain or change data latched to the first and second read and write circuits 120 and 150, respectively, in response to a data setting signal Data_set output from the data setting unit 186 during a data setting operation.

The plane state determination unit 185 may determine program states of the first plane 110 and the second plane 140 in response to the flag data DATA1 and DATA2 stored in the first plane 110 and the second plane 140, respectively, and output a first plane selection signal P0 and a second selection signal P1 according to the program states of the first plane 110 and the second plane 140, respectively.

The data setting unit 186 may generate the data setting signal Data_set to change the latched data after each read operation in response to the first and second plane selection signals P0 and P1 output from the plane state determination unit 185, and output the data setting signal Data_set to the control signal generation unit 184.

Figure 3:
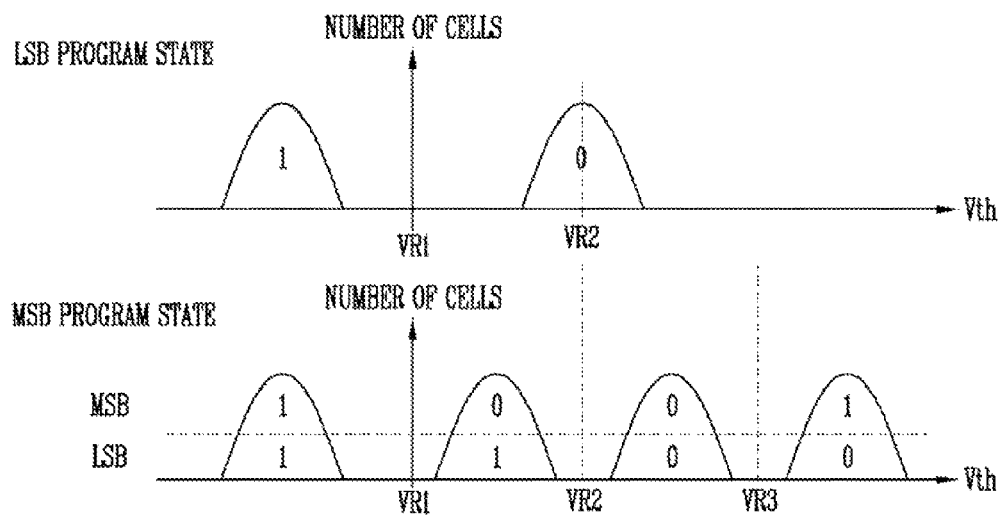
FIG. 3 is a distribution chart illustrating threshold voltage distributions according to program states of memory cells.

FIG. 3 is a distribution chart illustrating threshold voltage distributions according to program states of memory cells.

Figure 4:
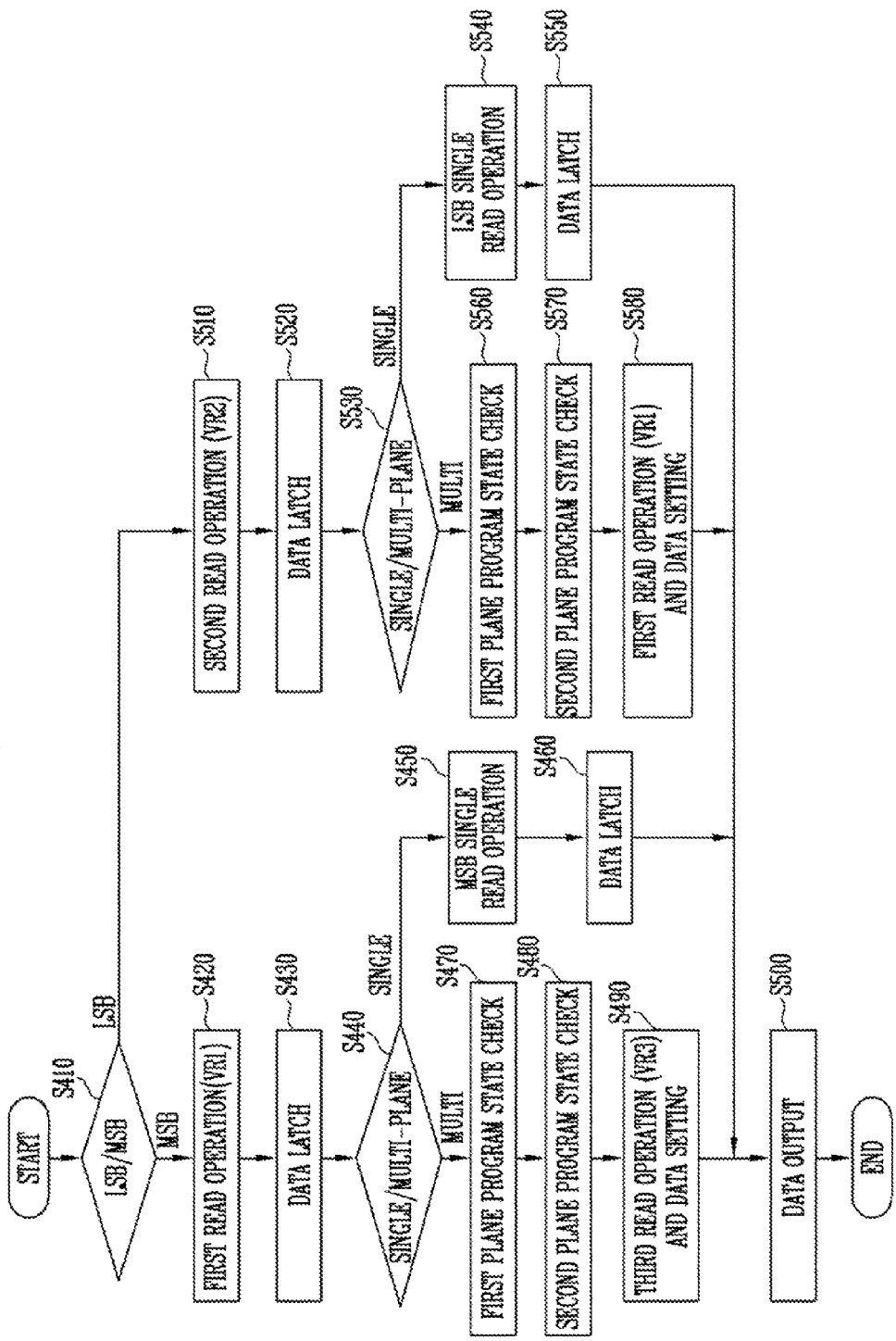
FIG. 4 is a flowchart illustrating an operating method of a semiconductor memory device according to an embodiment.

FIG. 4 is a flowchart illustrating an operating method of a semiconductor memory device according to an embodiment.

Referring to FIGS. 1 to 4, an operating method of a semiconductor memory device according to an embodiment is described below.

1) LSB/MSB Read Operation Determination (S410)

The LSB/MSB read operation selection unit 181 of the control logic 180 may receive the address ADDR which is externally input during a read operation, select the LSB read operation or the MSB read operation, and output the first determination result to the storage unit 183.

2) First Read Operation (S420)

When the MSB read operation is selected as a result of the above-described LSB/MSB read operation determination (S410), the storage unit 183 may output the internal control signal CTRL_INT for a first read operation.

The voltage generator 170 may output the first read voltage VR1 under the control of the control logic 180. Each of the first and second address decoders 130 and 160 may apply the first read voltage VR1 to a selected word line in a selected memory block in response to each of the address signals ADDR1 and ADDR2.

3) Data Latch (S430)

The control signal generation unit 184 may output the page buffer control signals PB_con1 and PB_con2 to control the first and second read and write circuits 120 and 150, respectively, in response to the internal control signal CTRL_INT. The first and second read and write circuits 120 and 150 may read and temporarily store data stored in the first and second planes 110 and 140 in response to the page buffer control signals PB_con1 and PB_con2, respectively. The read operation may be performed on the memory cells and the flag cells.

4) Single/Multi-Plane Read Operation Determination (S440)

The single/multi-plane selection unit 182 may determine whether the read operation is performed on a single plane or multiple planes during the read operation of the semiconductor memory device in response to the command CMD and the control signal CTRL, and output the second determination result to the storage unit 183.

5) MSB Single Plane Read Operation (S450)

As a result of the above-described single/multi-plane read operation determination (S440), when the single plane read operation is determined, the storage unit 183 may output the internal control signal CTRL_INT for an MSB data read operation.

The control logic 180 may control the voltage generator 170 and the first or second read and write circuit 120 or 150 to perform a second read operation or a third read operation, so that the MSB read operation may be performed on a selected plane from the first plane 110 and the second plane 140.

6) Data Latch (S460)

The control signal generation unit 184 may output the buffer control signal PB_con1 or PB_con2 to control a selected read and write circuit from the first and second read and write circuits 120 and 150 in response to the internal control signal CTRL_INT.

In response to the page buffer control signal PB_con1 or PB_con2, the selected read and write circuit may read and temporarily store MSB data stored in the first or second plane 110 or 140, and perform a data output operation (S500) to be described below.

7) First Plane Program State Check (S470)

As a result of the above-described single/multi-plane read operation determination (S440), when a multi-plane read operation is determined, the control logic 180 may receive the flag data DATA1 stored in the first read and write circuit 120.

The plane state determination unit 185 may determine a program state of the first plane 110 based on the flag data DATA1 and output the first plane selection signal P0. For example, when it is determined that the first plane 110 is programmed to an MSB program state, the plane state determination unit 185 may output the first plane selection signal P0 as '0', which is a logic low level. When it is determined that the first plane 110 is programmed to an LSB program state, the first plane selection signal P0 may be output as '1', which is a logic high level.

8) Second Plane Program State Check (S480)

The control logic 180 may receive the flag data DATA2 stored in the second read and write circuit 150.

The plane state determination unit 185 may determine a program state of the second plane 140 based on the flag data DATA2 and output the second plane selection signal P1. For example, when it is determined that the second plane 140 is programmed to the MSB program state, the plane state determination unit 185 may output the second plane selection signal P1 as '0', which is a logic low level. When it is determined that the second plane 140 is programmed to the LSB program state, the plane state determination unit 185 may output the second plane selection signal P1 as '1', which is a logic high level.

The above-described first plane program state check (S470) and the second plane program state check (S480) may be performed sequentially or simultaneously.

9) Third Read Operation and Data Setting Operation (S490)

The voltage generator 170 may output the third read voltage VR3 under the control of the control logic 180. Each of the first and second address decoders 130 and 160 may apply the third read voltage VR3 to the selected word line in the selected memory block in response to each of the address signals ADDR1 and ADDR2.

The data setting unit 186 may generate the data setting signal Data_set to change the latched data after each read operation in response to the first and second plane selection signals P0 and P1 output from the plane state determination unit 185, and output the data setting signal Data_set to the control signal generation unit 184.

For example, the data setting unit 186 may output the data setting signal Data_set to set the data latched to the first read and write circuit 120 to '1' when it is determined that the first plane 110 is programmed to the LSB program state in response to the first plane selection signal P0. In addition, the data setting unit 186 may output the data setting signal Data_set to set the data latched to the second read and write circuit 150 to '1' when it is determined that the second plane 140 is programmed to the LSB program state in response to the second plane selection signal P1.

When it is determined that the first plane 110 is programmed to the MSB program state, a third read operation may be performed using the third read voltage VR3, and the first read and write circuit 120 may sense new data and latch the new data as MSB data. In addition, when it is determined that the second plane 140 is programmed to the MSB program state, the third read operation may be performed using the third read voltage VR3, and the second read and write circuit 150 may sense new data and latch the new data as MSB data.

The data setting operation and the third read operation as described above may be performed at the same time.

In addition, as described above, during the MSB read operation, as for the LSB-programmed plane, the MSB data may be set to '1' and output, and as for the MSB-programmed plane, the data sensed during the third read operation may be latched as the MSB data.

10) Data Output (S500)

The data latched to the first and second read and write circuits 120 and 150 may be externally output from the first and second planes 110 and 140, respectively.

11) Second Read Operation (S510)

When the LSB read operation is selected as a result of the above-described LSB/MSB read operation determination (S410), the storage unit 183 may output the internal control signal CTRL_INT for the second read operation.

The voltage generator 170 may output the second read voltage VR2 under the control of the control logic 180. Each of the first and second address decoders 130 and 160 may apply the second read voltage VR2 to the selected word line in the selected memory block in response to each of the address signals ADDR1 and ADDR2.

The flag cells included in the first and second planes 110 and 140 may be programmed to have greater threshold voltages than the second read voltage VR2 during a program operation.

12) Data Latch (S520)

The control signal generation unit 184 may output the page buffer control signals PB_con1 and PB_con2 to control the first and second read and write circuits 120 and 150, respectively, in response to the internal control signal CTRL_INT. The first and second read and write circuits 120 and 150 may read and temporarily store the data stored in the first and second planes 110 and 140 in response to the page buffer control signals PB_con1 and PB_con2, respectively. The read operation may be performed on the memory cells and the flag cells.

13) Single/Multi-Plane Read Operation Determination (S530)

The single/multi-plane selection unit 182 may determine whether the read operation is performed on a single plane or multiple planes in response to the command CMD and the control signal CTRL, and output the second determination result to the storage unit 183.

14) LSB Single Plane Read Operation (S540)

When the single plane read operation is determined as a result of the above-described single/multi-plane read operation (S530), the storage unit 183 may output the internal control signal CTRL_INT for the LSB data read operation.

The control logic 180 may control the voltage generator 170 and the first or second read and write circuit 120 or 150 to perform the first read operation so that the LSB read operation may be performed on a selected plane from the first plane 110 and the second plane 140.

15) Data Latch (S550)

The control signal generation unit 184 may output the buffer control signal PB_con1 or PB_con2 to control a selected read and write circuit from the first and second read and write circuits 120 and 150 in response to the internal control signal CTRL_INT.

The selected read and write circuit may read and temporarily store the LSB data stored in the first or second plane 110 or 140 in response to the page buffer control signal PB_con1 or PB_con2, and perform the above-described data output operation (S500).

16) First Plane Program State Check (S560)

When a multi-plane read operation is determined as a result of the above-described single/multi-plane read operation determination (S440), the control logic 180 may receive the flag data DATA1 stored in the first read and write circuit 120.

The plane state determination unit 185 may determine a program state of the first plane 110 based on the flag data DATA1 and output the first plane selection signal P0. For example, when it is determined that the first plane 110 is programmed to the MSB program state, the plane state determination unit 185 may output the first plane selection signal P0 as '0', which is a logic low level. When it is determined that the first plane 110 is programmed to the LSB program state, the first plane selection signal P0 may be output as '1', which is a logic high level.

17) Second Plane Program State Check (S570)

The control logic 180 may receive the flag data DATA2 stored in the second read and write circuit 150.

The plane state determination unit 185 may determine a program state of the second plane 140 based on the flag data DATA2 and output the second plane selection signal P1. For example, when it is determined that the second plane 140 is programmed to the MSB program state, the second plane selection signal P1 may be output as '0', which is a logic low level. The second plane 140 may output the second plane selection signal P1 as '1', which is a logic high level, when it is determined that the second plane 140 is programmed to the LSB program state.

The above-described first plane program state check (S470) and the second plane program state check (S480) may be performed sequentially or simultaneously.

18) First Read Operation and Data Setting Operation (S580)

The voltage generator 170 may output the first read voltage VR1 under the control of the control logic 180. Each of the first and second address decoders 130 and 160 may apply the first read voltage VR1 to the selected word line in the selected memory block in response to each of the address signals ADDR1 and ADDR2.

The data setting unit 186 may generate and output the data setting signal Data_set to the control signal generation unit 184 to maintain the latched data in response to the first and second plane selection signals P0 and P1 output from the plane state determination unit 185.

For example, the data setting unit 186 may output the data setting signal Data_set to maintain the data latched to the first read and write circuit 120 when the first plane 110 is programmed to the MSB program state in response to the first plane selection signal P0. In addition, the data setting unit 186 may output the data setting signal Data_set to maintain the data latched to the second read and write circuit 150 when the second plane 140 is programmed to the MSB program state in response to the second plane selection signal P1.

When it is determined that the first plane 110 is programmed to the LSB program state, the first read operation using the first read voltage VR1 may be performed, and the first read and write circuit 120 may sense new data and latch the new data as LSB data. In addition, when it is determined that the second plane 140 is programmed to the LSB program state, the first read operation using the first read voltage VR1 may be performed, and the second read and write circuit 150 may sense new data and latch the new data as the LSB data. Subsequently, the above-described data output (S500) may be performed.

The above-described data setting operation and first read operation may be performed at the same time.

As described above, during the LSB read operation, the MSB-programmed plane may maintain data, which is sensed during the previously performed second read operation, as the LSB data, and the LSB-programmed plane may latch newly sensed data as the LSB data.

Figure 5:
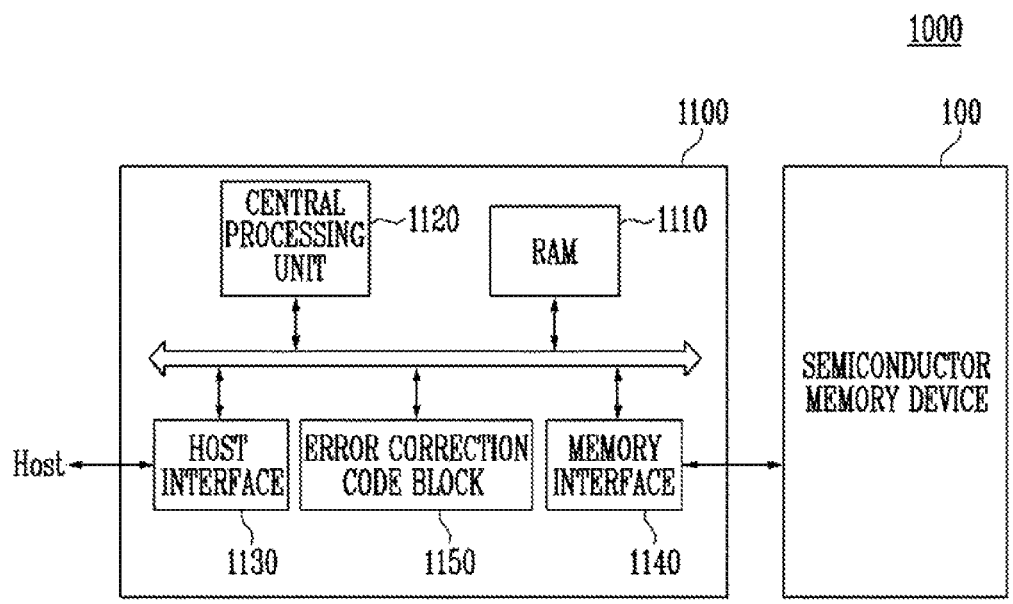
FIG. 5 is a block diagram illustrating a memory system including the semiconductor memory device shown in FIG. 1.

FIG. 5 is a block diagram illustrating a memory system 1000 including the semiconductor memory device 100 shown in FIG. 1.

Referring to FIG. 5, the memory system 1000 according to the embodiment may include the semiconductor memory device 100 and a controller 1100.

Since the semiconductor memory device 100 is configured and manufactured as described above with reference to FIG. 1, a detailed description thereof will be omitted.

The controller 1100 may be connected to a host and the semiconductor memory device 100 and may be suitable for accessing the semiconductor memory device 100 in response to a request from the host. For example, the controller 1100 may be suitable for controlling read, write, erase and background operations of the semiconductor memory device 100. The controller 1100 may be suitable for interfacing between the semiconductor memory device 100 and the host. The controller 1100 may be suitable for operating firmware to control the semiconductor memory device 100.

The controller 1100 may include random access memory (RAM) 1110, a central processing unit (CPU) 1120, a host interface 1130, a memory interface 1140, and an error correction code (ECC) block 1150. The RAM 1110 may be used as an operation memory of the CPU 1120, a cache memory between the memory device 1200 and the host, and a buffer memory between the memory device 1200 and the host. The CPU 1120 may control the overall operation of the controller 1100. The controller 1100 may temporarily store program data provided from the host during a read operation.

The host interface 1130 may include a protocol for data exchange between the host and the controller 1100. For example, the controller 1100 may communicate with the host through at least one of various protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol and a private protocol.

The memory interface 1140 may be suitable for interfacing with the semiconductor memory device 100. For example, the memory interface 1140 may include a NAND flash interface or a NOR flash interface.

The ECC block 1150 may be suitable for detecting and correcting errors in data read from the semiconductor memory device 100 using an error correcting code. The CPU 1120 may control a read voltage according to an error detection result of the ECC block 1150 and control the semiconductor memory device 100 to perform a re-read operation. According to an embodiment, the ECC block may be provided as a component of the controller 1100.

The controller 1100 and the semiconductor memory device 100 may be integrated in one semiconductor device. According to an embodiment, the controller 1100 and the semiconductor memory device 100 may be integrated in a single semiconductor device to form a memory card such as a personal computer memory card international association (PCMCIA), a compact flash card (CF), a smart media card (SMC), a memory stick, a multimedia card (MMC), a reduced size MMC (RS-MMC), a micro-MMC, a secure digital (SD) card, a mini-SD, a micro-SD, an SDHC, a universal flash storage device (UFS), etc.

The controller 1100 and the semiconductor memory device 100 may be integrated in one semiconductor device to form a semiconductor drive, e.g., a Solid State Drive (SSD). The semiconductor drive (SSD) may include a storage device configured to store data in a semiconductor memory. When the memory system 2000 is used as the semiconductor drive (SSD), the operating speed of the host coupled to the memory system 1000 may be significantly improved.

In another example, the memory system 1000 may be used as one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home networks, one of various electronic devices for computer networks, one of various electronic devices for telematics networks, an RFID device and/or one of various devices for computing systems, etc.

In an exemplary embodiment, the semiconductor memory device 100 or the memory system 1000 may be packaged in a variety of ways. For example, in some embodiments, the semiconductor memory device 100 or the memory system 1000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP) and/or a wafer-level processed stack package (WSP), etc.

Figure 6:
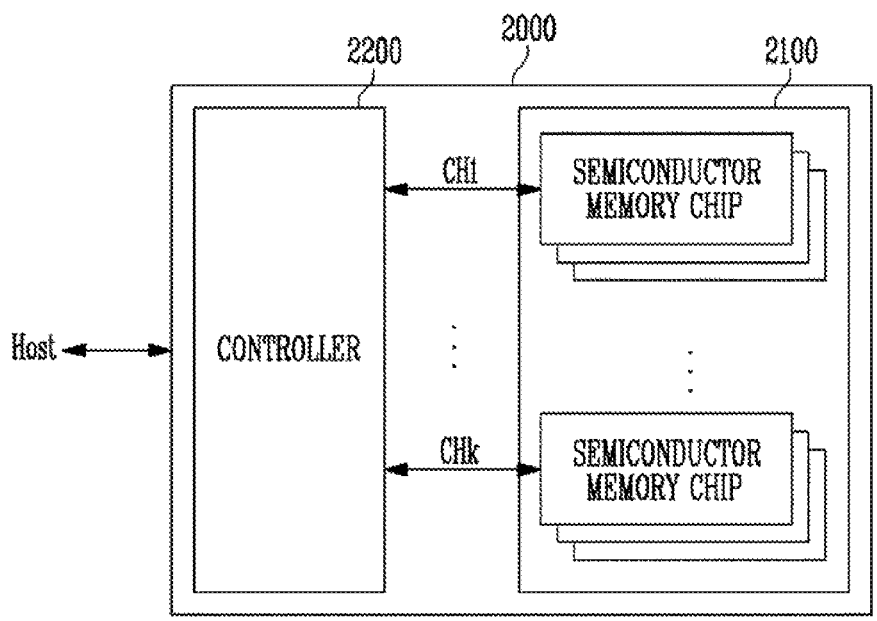
FIG. 6 is a block diagram illustrating an applied example of the memory system shown in FIG. 5.

FIG. 6 is a block diagram illustrating an applied example 2000 of the memory system 1000 shown in FIG. 5.

Referring to FIG. 6, a memory system 2000 may include a semiconductor memory device 2100 and a controller 2200. The semiconductor memory device 2100 may include a plurality of semiconductor memory chips. The semiconductor memory chips may be divided into a plurality of groups.

FIG. 6 illustrates that the plurality of groups in the in the semiconductor memory chips communicate with the controller 2200 through first to k-th channels CH1 to CHk, respectively. Each of the memory chips may be configured and operated in substantially the same manner as the semiconductor memory device 100 described above with reference to FIG. 1.

Each of the groups in the semiconductor memory chips may communicate with the controller 2200 through a single common channel. The controller 2200 may be configured in substantially the same manner as the controller 1100 described above with reference to FIG. 5 and may control the plurality of memory chips of the semiconductor memory device 2100.

Figure 7:
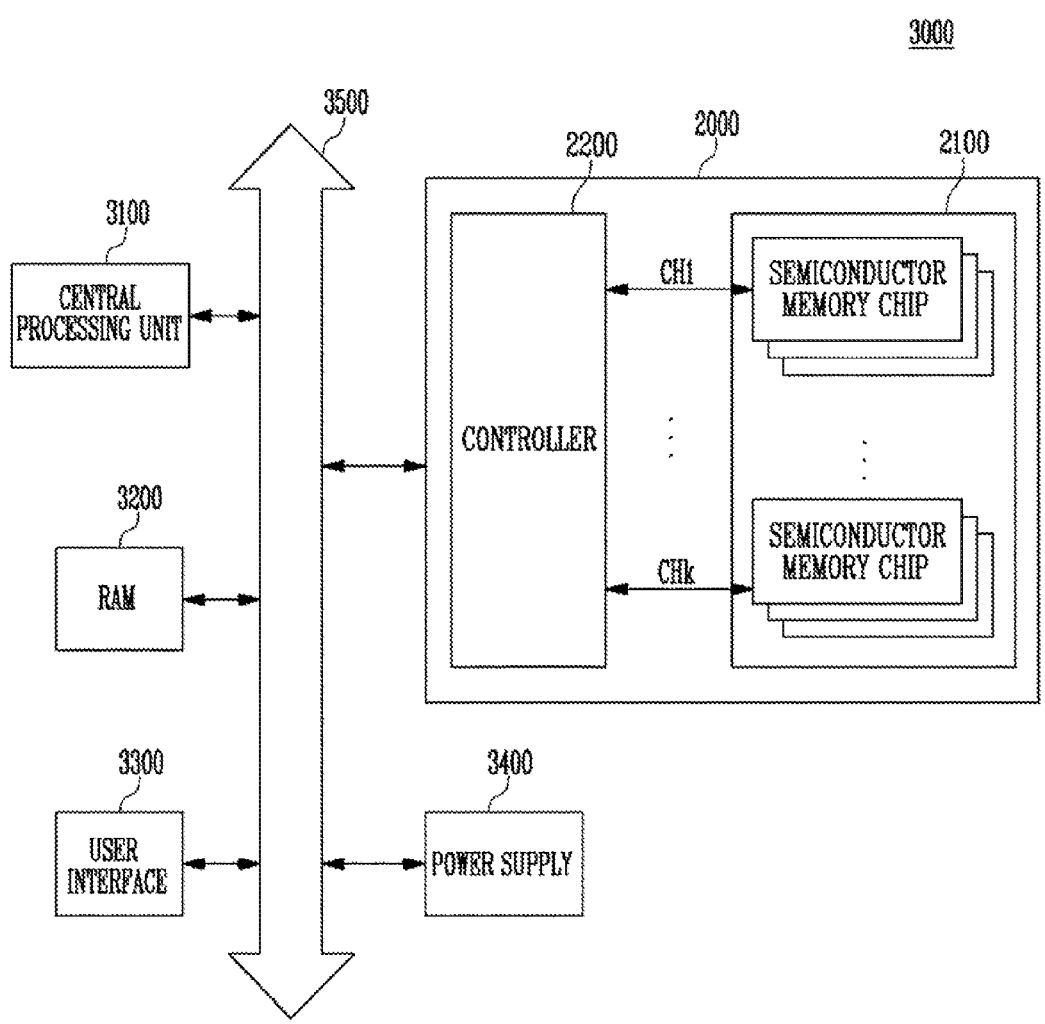
FIG. 7 is a block diagram illustrating a computing system including the memory system shown in FIG. 6.

FIG. 7 is a block diagram illustrating a computing system 3000 including the memory system 2000 shown in FIG. 6.

Referring to FIG. 7, the computing system 3000 may include a central processing unit 3100, random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

FIG. 7 illustrates the semiconductor memory device 2100 coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 7 illustrates the memory system 2000 described above with reference to FIG. 6. However, the memory system 2000 may be replaced with the memory system 1000 described above with reference to FIG. 5. In an exemplary embodiment, the computing system 3000 may include both memory systems 1000 and 2000 described above with reference to FIGS. 5 and 6, respectively.

According to an embodiment of the present invention, a read operation may be performed on multiple planes programmed to different program states, and data may be output by setting data latched according to the program states during the read operation so as not to cause an additional increase in operating time.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor memory device comprising:
    a first plane and a second plane, each including a plurality of memory blocks;
    a first read and write circuit and a second read and write circuit suitable for sensing and temporarily storing data programmed into the first and second planes, respectively; and
    a control logic suitable for controlling the first and second read and write circuits to perform a read operation on the first and second planes, respectively, wherein the control logic controls the first and second read and write circuits to set the temporarily stored data as setting data, performs a new read operation to store new data, or maintains the temporarily stored data, depending on whether the first and second planes are in an LSB program state or an MSB program state.

2. The semiconductor memory device of claim 1, further comprising:
    a voltage generator suitable for generating a plurality of read voltages; and
    a first address decoder and a second address decoder suitable for applying the plurality of read voltages to the first and second planes, respectively.

3. The semiconductor memory device of claim 1, wherein each of the memory blocks includes memory cells and a flag cell which stores information on whether an MSB program operation or an LSB program operation is performed on the memory cells.

4. The semiconductor memory device of claim 1, wherein the control logic comprises:
    a plane state determination unit suitable for determining program states of the first plane and the second plane based on first flag data stored in the first plane and second flag data stored in the second plane, respectively, to output a first plane selection signal and a second plane selection signal;
    a data setting unit suitable for outputting a data setting signal to set the temporarily stored data as the setting data in response to the first and second plane selection signals; and
    a control signal generation unit suitable for outputting a first page buffer control signal and a second page buffer control signal to control the first read and write circuit and the second read and write circuit, respectively, in response to the data setting signal.

5. The semiconductor memory device of claim 4, wherein the control logic further comprises:
    an LSB/MSB read operation selection unit suitable for determining an MSB read operation or an LSB read operation to output a first determination result in response to an address signal;
    a single/multi-plane selection unit suitable for determining a single plane read operation or a multi-plane read operation to output a second determination result in response to a command and a control signal which are externally input; and
    a storage unit suitable for selecting an algorithm stored therein in response to the first determination result and the second determination result to output an internal control signal,
    wherein the control signal generation unit outputs the first and second page buffer control signals in response to the internal control signal.

6. The semiconductor memory device of claim 1, wherein the control logic controls the first and second read and write circuits to store the data programmed into the first and second planes by performing a first read operation using a first read voltage during an MSB read operation in a multi-plane read operation, and the control logic determines program states of the first and second planes based on flag data, among the data stored in the first and second read and write circuits, respectively.

7. The semiconductor memory device of claim 6, wherein the control logic controls the first read and write circuit to set the temporarily stored data as the setting data when the first plane is in the LSB program state, and the control logic controls the second read and write circuit to set the temporarily stored data as the setting data when the second plane is in the LSB program state.

8. The semiconductor memory device of claim 6, wherein the control logic controls the first and second read and write circuits to store the data programmed into the first plane by performing a third read operation using a third read voltage when the first plane is in the MSB program state, and the control logic controls the second read and write circuit to store the data programmed into the second plane by performing the third read operation when the second plane is in the MSB program state.

9. The semiconductor memory device of claim 1, wherein the control logic controls the first and second read and write circuits to store the data programmed into the first and second planes by performing a second read operation using a second read voltage during an LSB read operation in a multi-plane read operation, and the control logic determines program states of the first and second planes based on flag data, among the data stored in the first and second read and write circuits, respectively.

10. The semiconductor memory device of claim 9, wherein the control logic controls the first read and write circuit to maintain the temporarily stored data when the first plane is in the MSB program state, and the control logic controls the second read and write circuit to maintain the temporarily stored data when the second plane is in the MSB program state.

11. The semiconductor memory device of claim 9, wherein the control logic controls the first read and write circuit to store the data programmed into the first plane by performing a first read operation using a first read voltage when the first plane is in the LSB program state, and the control logic controls the second read and write circuit to store the data programmed into the second plane by performing the first read operation when the second plane is in the LSB program state.

12. A semiconductor memory device comprising:
a first plane and a second plane each including a plurality of memory blocks;
a first read and write circuit and a second read and write circuit suitable for sensing and temporarily storing data programmed into the first and second planes, respectively; and
a control logic suitable for determining first and second flag data respectively stored in the first and second planes, and outputting first and second page buffer control signals to respectively control the first and second read and write circuits to set the temporarily stored data as setting data, or maintain the temporarily stored data.

13. The semiconductor memory device of claim 12, wherein the first and second flag data indicates information on whether an MSB program operation or an LSB program operation is performed on the first plane and the second plane, respectively.

14. The semiconductor memory device of claim 12, wherein the control logic comprises:

a plane state determination unit suitable for determining program states of the first plane and the second plane based on the first flag data and the second flag data to output a first plane selection signal and a second plane selection signal, respectively;
a data setting unit suitable for outputting a data setting signal to set the temporarily stored data as the setting data in response to the first and second plane selection signals; and
a control signal generation unit suitable for outputting the first and second page buffer control signals in response to the data setting signal.

15. The semiconductor memory device of claim 14, wherein the control logic further comprises:
an LSB/MSB read operation selection unit suitable for determining an MSB read operation or an LSB read operation in response to an address signal, and outputting a first determination result;
a single/multi-plane selection unit suitable for determining a single plane read operation or a multi-plane read operation in response to a command and a control signal which are externally input, and outputting a second determination result; and
a storage unit suitable for selecting an algorithm stored therein in response to the first determination result and the second determination result to output an internal control signal,
wherein the control signal generation unit outputs the first and second page buffer control signals in response to the internal control signal.

16. The semiconductor memory device of claim 12, wherein the control logic controls the first and second read and write circuits to store the data programmed into the first and second planes by performing a first read operation using a first read voltage during an MSB read operation in a multi-plane read operation, and the control logic determines program states of the first and second planes based on the first and second flag data, respectively.

17. The semiconductor memory device of claim 16, wherein the control logic controls the first read and write circuit to set the temporarily stored data as the setting data when the first plane is in an LSB program state, and the control logic controls the second read and write circuit to set the temporarily stored data as the setting data when the second plane is in the LSB program state.

18. The semiconductor memory device of claim 16, wherein the control logic controls the first and second read and write circuits to store the data programmed into the first plane by performing a third read operation using a third read voltage when the first plane is in an MSB program state, and the control logic controls the second read and write circuit to store the data programmed into the second plane by performing the third read operation when the second plane is in the MSB program state.

19. The semiconductor memory device of claim 12, wherein the control logic controls the first and second read and write circuits to store the data programmed into the first and second planes by performing a second read operation using a second read voltage during an LSB read operation in a multi-plane read operation, and the control logic determines program states of the first and second planes based on the first and second flag data, respectively.

20. The semiconductor memory device of claim 19, wherein the control logic controls the first read and write circuit to maintain the temporarily stored data when the first plane is in an MSB program state, and the control logic controls the second read and write circuit to maintain the temporarily stored data when the second plane is in the MSB program state.

21. The semiconductor memory device of claim 19, wherein the control logic controls the first read and write circuit to store the data programmed into the first plane by performing a first read operation using a first read voltage when the first plane is in an LSB program state, and the control logic controls the second read and write circuit to store the data programmed into the second plane by performing the first read operation when the second plane is in the LSB program state.

* * * * *